United States Patent
Sunder et al.

(10) Patent No.: US 10,380,299 B2
(45) Date of Patent: Aug. 13, 2019

(54) CLOCK TREE SYNTHESIS GRAPHICAL USER INTERFACE

(71) Applicant: Mentor Graphics Corporation, Wilsonville, OR (US)

(72) Inventors: Sivaprakasam Sunder, Cupertino, CA (US); Kirk Schlotman, Plano, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 932 days.

(21) Appl. No.: 14/873,008

(22) Filed: Oct. 1, 2015

(65) Prior Publication Data

US 2016/0018979 A1    Jan. 21, 2016

Related U.S. Application Data

(63) Continuation of application No. 13/274,276, filed on Oct. 14, 2011, now Pat. No. 9,310,831, which is a continuation-in-part of application No. 12/036,191, filed on Feb. 22, 2008, now abandoned, and a
(Continued)

(51) Int. Cl.
| | |
|---|---|
| *G06F 17/50* | (2006.01) |
| *G06T 17/10* | (2006.01) |
| *G06F 17/11* | (2006.01) |
| *G06F 1/10* | (2006.01) |
| *G06F 3/0482* | (2013.01) |

(Continued)

(52) U.S. Cl.
CPC ............ *G06F 17/5045* (2013.01); *G06F 1/10* (2013.01); *G06F 3/0482* (2013.01); *G06F 3/04842* (2013.01); *G06F 3/04847* (2013.01); *G06F 17/11* (2013.01); *G06F 17/5031* (2013.01); *G06F 17/5072* (2013.01); *G06F 17/5081* (2013.01); *G06T 11/206* (2013.01); *G06T 17/10* (2013.01); *G06F 2217/62* (2013.01); *G06T 2200/24* (2013.01)

(58) Field of Classification Search
USPC ....................................................... 716/134
See application file for complete search history.

(56) References Cited

U.S. PATENT DOCUMENTS

| | | |
|---|---|---|
| 5,617,426 A | 4/1997 | Koenemann et al. |
| 6,204,713 B1 | 3/2001 | Adams et al. |
| 6,298,468 B1 | 10/2001 | Zhen |

(Continued)

OTHER PUBLICATIONS

International Search Report and Written Opinion dated Apr. 13, 2009 from International Patent Application No. PCT/US2009/034583, 8 pages.

(Continued)

*Primary Examiner* — Mohammed Alam
(74) *Attorney, Agent, or Firm* — Mentor Graphics Corporation

(57) ABSTRACT

In one embodiment, a method for performing an analysis of a synthesized clock tree can include: displaying a plurality of variation parameters and one or more analysis values on a display screen; accepting a first signal from a user input device to select one of the variation parameters; accepting a second signal from a user input device to select one or more of the analysis values; and displaying a plurality of pins from the synthesized clock tree with the selected variation parameter and the selected one or more analysis values on the display screen.

20 Claims, 9 Drawing Sheets

Related U.S. Application Data continuation-in-part of application No. 12/026,755, filed on Feb. 6, 2008, now abandoned.

(51) Int. Cl.
*G06F 3/0484* (2013.01)
*G06T 11/20* (2006.01)

(56) References Cited

U.S. PATENT DOCUMENTS

| | | |
|---|---|---|
| 6,407,756 B1 | 6/2002 | Sontag et al. |
| 6,460,166 B1 | 10/2002 | Reddy et al. |
| 6,530,065 B1 | 3/2003 | McDonald et al. |
| 6,782,519 B2 | 8/2004 | Chang et al. |
| 6,836,877 B1 | 12/2004 | Dupenloup |
| 6,904,572 B2 | 6/2005 | Igarashi |
| 6,909,311 B2 | 6/2005 | Foley et al. |
| 6,944,840 B2 | 9/2005 | Sasaki et al. |
| 7,020,854 B2 | 3/2006 | Killian et al. |
| 7,039,891 B2 | 5/2006 | Tetelbaum |
| 7,042,269 B2 | 5/2006 | Kao |
| 7,051,310 B2 | 5/2006 | Tsao |
| 7,191,417 B1 | 3/2007 | Luo et al. |
| 7,216,322 B2 | 5/2007 | Lai et al. |
| 7,225,421 B2 | 5/2007 | Migatz et al. |
| 7,275,235 B2 | 9/2007 | Molinari et al. |
| 7,299,433 B2 | 11/2007 | Clement et al. |
| 7,334,209 B1 | 2/2008 | Roberts et al. |
| 7,406,672 B2 | 7/2008 | Fukuda |
| 7,418,689 B2 | 8/2008 | Habitz et al. |
| 7,479,825 B2 | 1/2009 | Komoda |
| 7,486,130 B2 | 2/2009 | Overs |
| 7,519,923 B2 | 3/2009 | Tsuchiya |
| 7,519,927 B1 | 4/2009 | Hryckowian et al. |
| 7,523,430 B1 | 4/2009 | Patel |
| 7,526,666 B1 | 4/2009 | Soni |
| 7,555,740 B2 | 6/2009 | Buck et al. |
| 7,584,443 B1 | 9/2009 | Govig et al. |
| 7,624,364 B2 | 11/2009 | Albrecht et al. |
| 7,689,957 B2 | 3/2010 | Shenoy |
| 7,810,061 B2 | 10/2010 | Minonne et al. |
| 7,930,652 B2 | 4/2011 | Wood |
| 7,996,804 B2 | 8/2011 | Nikitin et al. |
| 2002/0045995 A1 | 4/2002 | Shimazaki et al. |
| 2003/0048122 A1 | 3/2003 | Kazi |
| 2003/0058280 A1 | 3/2003 | Molinari et al. |
| 2003/0135836 A1 | 7/2003 | Chang et al. |
| 2003/0167451 A1 | 9/2003 | Igarashi |
| 2004/0225984 A1 | 11/2004 | Tsao |
| 2005/0050497 A1 | 3/2005 | Tetelbaum |
| 2006/0053395 A1 | 3/2006 | Lai et al. |
| 2006/0064658 A1 | 3/2006 | Minonne et al. |
| 2006/0132186 A1 | 6/2006 | Bourgin |
| 2006/0190899 A1 | 8/2006 | Migatz et al. |
| 2006/0248488 A1 | 11/2006 | Habitz et al. |
| 2006/0288320 A1* | 12/2006 | Murgai .............. G06F 1/10 716/104 |
| 2007/0094627 A1 | 4/2007 | Komoda |
| 2007/0106970 A1 | 5/2007 | Fukuda |
| 2007/0136708 A1 | 6/2007 | Overs et al. |
| 2007/0171733 A1 | 7/2007 | Wood |
| 2007/0220465 A1 | 9/2007 | Tsuchiya |
| 2007/0288875 A1 | 12/2007 | Eakins et al. |
| 2009/0064067 A1 | 3/2009 | Liu et al. |
| 2009/0070714 A1 | 3/2009 | Shenoy |
| 2009/0179680 A1 | 7/2009 | Reuland et al. |
| 2009/0187873 A1 | 7/2009 | Nikitin et al. |
| 2009/0199143 A1 | 8/2009 | Sclotman et al. |
| 2009/0217225 A1 | 8/2009 | Sunder et al. |
| 2009/0254874 A1 | 10/2009 | Bose |
| 2010/0049481 A1 | 2/2010 | Walker et al. |
| 2012/0240091 A1 | 9/2012 | Sunder et al. |

OTHER PUBLICATIONS

International Search Report and Written Opinion dated Mar. 13, 2009 from International Patent Application No. PCT/US2009/033203, 6 pages.

* cited by examiner

CLOCK TREE SYNTHESIS GRAPHICAL USER INTERFACE

CROSS REFERENCE TO RELATED APPLICATION

This application is a continuation of U.S. patent application Ser. No. 13/274,276, filed Oct. 14, 2011, entitled "MULTI-MODE MULTI-CORNER CLOCKTREE SYNTHESIS", which is a continuation-in-part of U.S. patent application Ser. No. 12/036,191, filed Feb. 22, 2008, entitled "MULTI-MODE MULTI-CORNER CLOCKTREE SYNTHESIS," and which is also a continuation-in-part of U.S. patent application Ser. No. 12/026,755, filed Feb. 6, 2008, entitled "CLOCK TREE SYNTHESIS GRAPHICAL USER INTERFACE," all of which are hereby incorporated by reference.

BACKGROUND

Particular embodiments generally relate to circuit design automation tools, and more specifically to clock tree synthesis analysis tools.

Design automation tools allow integrated circuit (IC) ("chip") or board-level designers to implement increasingly complex designs. One such automation tool is a clock tree synthesis (CTS) tool that can balance and route a clock signal to very large numbers of registers, gates, circuits, etc., while optimizing for skew, capacitance, signal slew rates, and other factors. However, conventional graphical user interfaces (GUIs) for analyzing CTS results are limited.

SUMMARY

In one embodiment, a method for performing an analysis of a synthesized clock tree can include: displaying a plurality of variation parameters and one or more analysis values on a display screen; accepting a first signal from a user input device to select one of the variation parameters; accepting a second signal from a user input device to select one or more of the analysis values; and displaying a plurality of pins from the synthesized clock tree with the selected variation parameter and the selected one or more analysis values on the display screen.

A further understanding of the nature and the advantages of particular embodiments disclosed herein may be realized by reference to the remaining portions of the specification and the attached drawings.

DETAILED DESCRIPTION OF EMBODIMENTS

User interfaces for design automation tools (e.g., place and route tools, circuit synthesis, clock tree synthesis (CTS) tools, circuit and logic simulation tools, etc.) often include disparate design automation result formats or presentations. For example, some data relating to CTS results in some cases may be in textual format, while other data (e.g., a physical layout representation) may be in graphical format. In particular embodiments, a relatively large variety and volume of data related to a synthesized clock tree is made available to a user via a graphical user interface (GUI).

Figure 1:
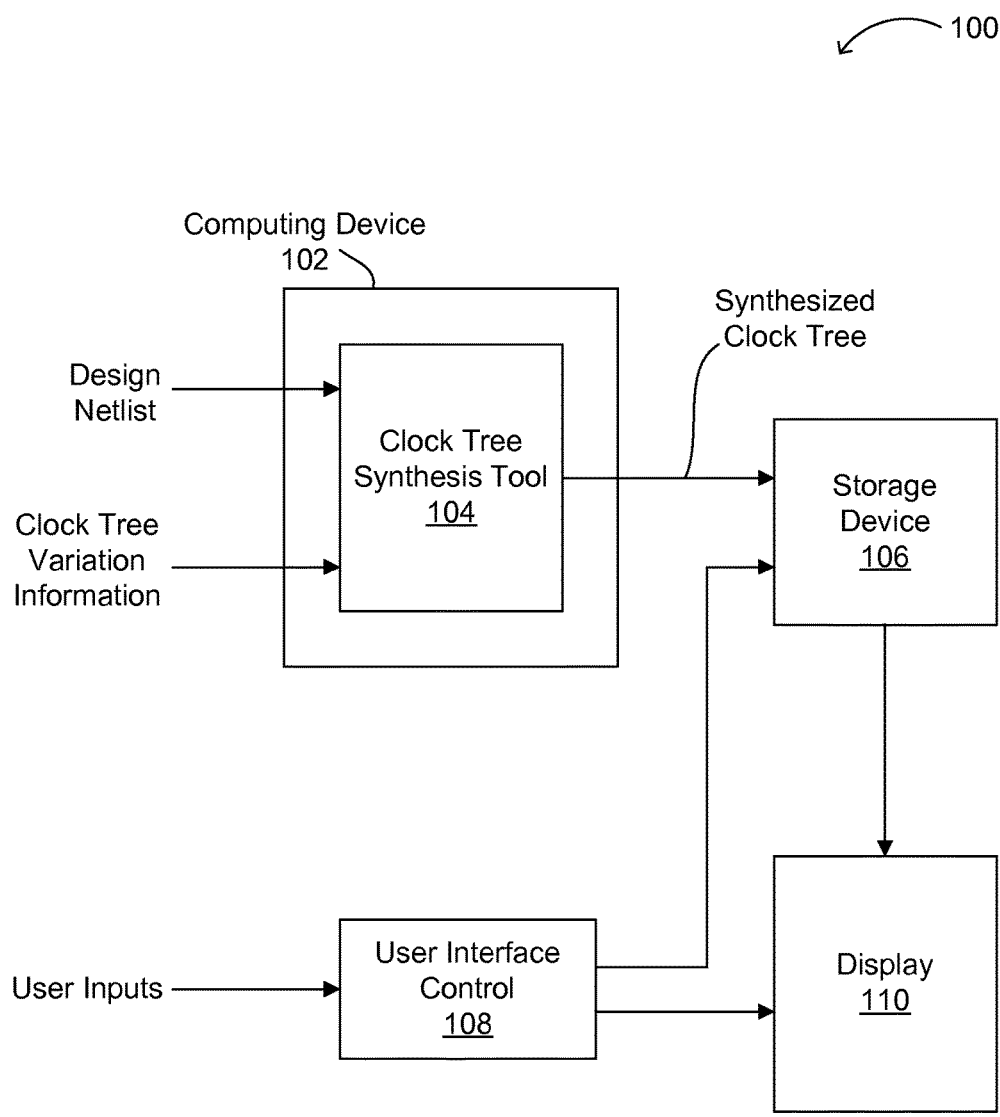
FIG. 1 illustrates an example system for clock tree synthesis (CTS) and analysis in accordance with embodiments of the present invention.

Referring now to FIG. 1, shown is an example system 100 for CTS and analysis in accordance with embodiments of the present invention. CTS tool 104 is provided. Although one instance of CTS tool 104 is shown, it will be understood that many instances may be provided and may perform processing in parallel. CTS tool 104 may be found on a computing device 102, such as a personal computer, laptop computer, workstation, or other computing device. In one embodiment, CTS tool 104, as well as user interface control 108, may include software stored on a computer-readable storage media that may be read and executed by one or more processors of the computing device to perform clock tree synthesis and analysis. In general, any suitable computing design or architecture can be employed to provide the functionality described herein. For example, components or subsystems may be modified, added to, or removed from those shown in FIG. 1. Functions may be implemented in hardware, software or a combination of both, as desired.

CTS tool 104 can receive a design, such as an integrated circuit (IC) or board-level design (e.g., in the form of a design netlist), and can perform clock tree synthesis for the design. Netlists typically convey connectivity information (e.g., instances, nets, attributes, etc.). Clock tree synthesis can include building a clock tree to distribute a clock signal to inputs or other signals of devices, components, circuits (e.g., standard cells, buffers, gates, etc.) in the IC design referred to as "pins". In building the clock tree, CTS tool 104 may use timing information for different sets of clock tree variation parameters. The clock tree variation parameters may include different parameters for one or more process "corners" and/or multiple modes of operation in order to meet design specifications and/or to improve design margin to the specifications. Using these parameters, different sets of timing information may be determined and used to build an optimal clock tree.

A process corner or variation parameter may involve conditions for voltage, temperature, or other process variations (e.g., transistor performance characteristics due to semiconductor processing variations). Variation parameters may model semiconductor manufacturing or other process variations that may occur during fabrication of the integrated circuit design. That is, when the integrated circuit design is fabricated on silicon, different process variations may occur.

The variation parameters can also model different voltage and temperature conditions. In one example, a number (e.g., about 9-12) of different variation parameters may be provided. Depending on particular variation parameters, timing delays and other signal characteristics (e.g., within a synthesized clock tree) may differ.

CTS tool 104 may take into account different sets of clock tree variation parameters in determining the placement of clock tree nodes or pins in a clock tree. For example, clock tree nodes include buffers (e.g., a ratioed series of inverters). Clock tree nodes may also include other logic elements used to fan out a clock signal. CTS tool 104 may place clock tree nodes for devices to be clocked. For example, CTS tool 104 synthesizes a clock tree for delivering a clock signal to a number of clocked devices, such as registers, latches, flip-flops, etc., that are clocked by the same clock signal. Each of the clocked devices may include pins to which clock tree nodes are connected. A hierarchy of clock tree nodes may be provided to fan the clock signal out from a root node to the receiving pins.

CTS tool 104 determines the placement of clock tree nodes during clock tree synthesis. In determining the placement, clock skew, and/or other metrics (e.g., area, power, insertion delays, etc.) may be optimized based on different sets of clock tree timing variation parameters. For example, the different sets of variation parameters yield different timing information for the clock tree, and such optimization can be performed substantially in a simultaneous fashion to obtain preferred quality of results (QoR). In one example, when optimizing clock skew using one variation parameter, how the clock skew is affected for other variation parameters is also analyzed. Thus, if the clock tree is adjusted to improve skew for one variation parameter, CTS tool 104 balances whether clock skew for another variation parameter is significantly worsened. Thus, balancing clock skew for multiple variation parameters may be performed in synthesizing the clock tree. Particular embodiments allow for an analysis of multi-corner process information and/or multi-mode process information using a single tool/GUI.

As shown, a synthesized clock tree can be stored (e.g., in storage device 106) for subsequent analysis, as well as further design. In particular embodiments, user interface control 108 can access storage device 106 for CTS GUI analysis on display 110. Further, user interface control 108 can receive user inputs, such as from a user input device (e.g., a keyboard, mouse, any suitable pointing device, speech recognition engine for voice inputs, or any suitable device for receiving commands from a user), or any combination of user input devices, and generate control signals therefrom. In addition, one or more components shown in FIG. 1, such as storage device 106 and/or user interface control 108, can be integrated with computing device 102.

Figure 2:
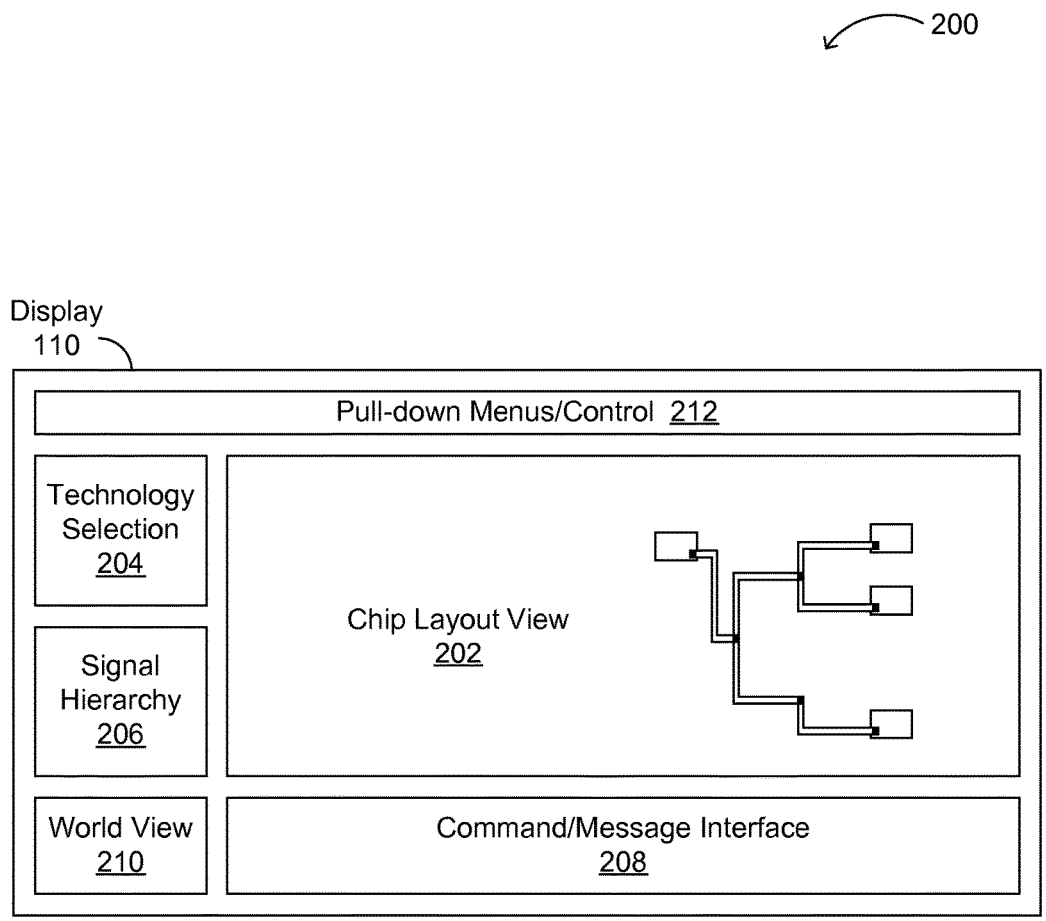
FIG. 2 illustrates an example main graphical user interface (GUI) window in accordance with embodiments of the present invention.

Referring now to FIG. 2, shown is an example main GUI window 200 in accordance with embodiments of the present invention. Display 110 can include a chip layout view 202, which can include clock path traces and/or actual physical layout (e.g., mask patterns). Technology selection 204 can include layouts and libraries (e.g., standard cell libraries) for different design technologies (e.g., 45 nm CMOS process technology). Signal hierarchy 206 can include partitions and region identifications to help isolate particular signal paths or segments. Command/message interface 208 can include a textual command interface. World view 210 can include a higher level or full-chip view of the layout found in window portion 202. Pull-down menus/control 212 can include file manipulation, tool access, and window controls.

Figure 7:
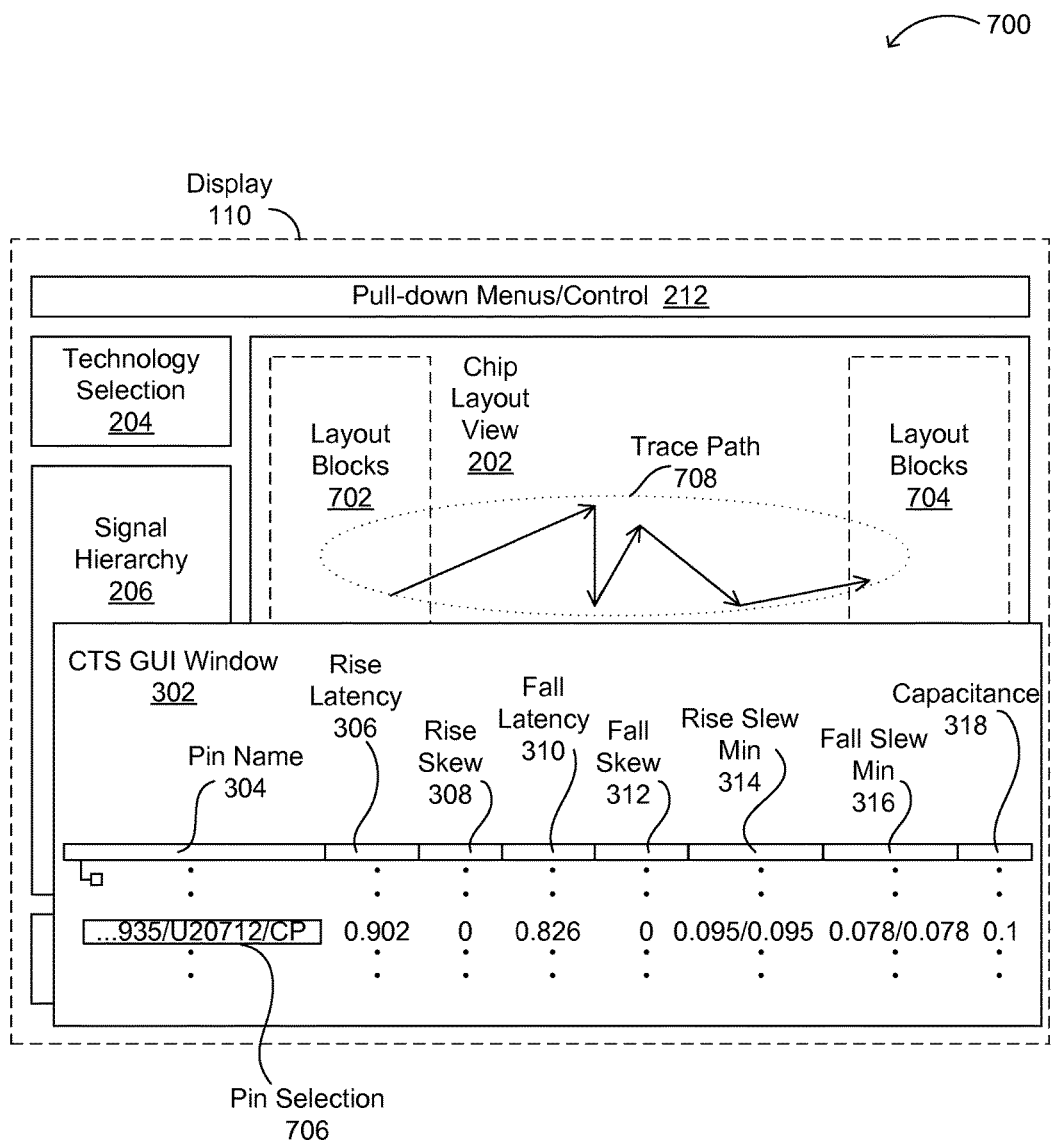
FIG. 7 illustrates an example path trace in a main GUI window in accordance with embodiments of the present invention.
Figure 9:
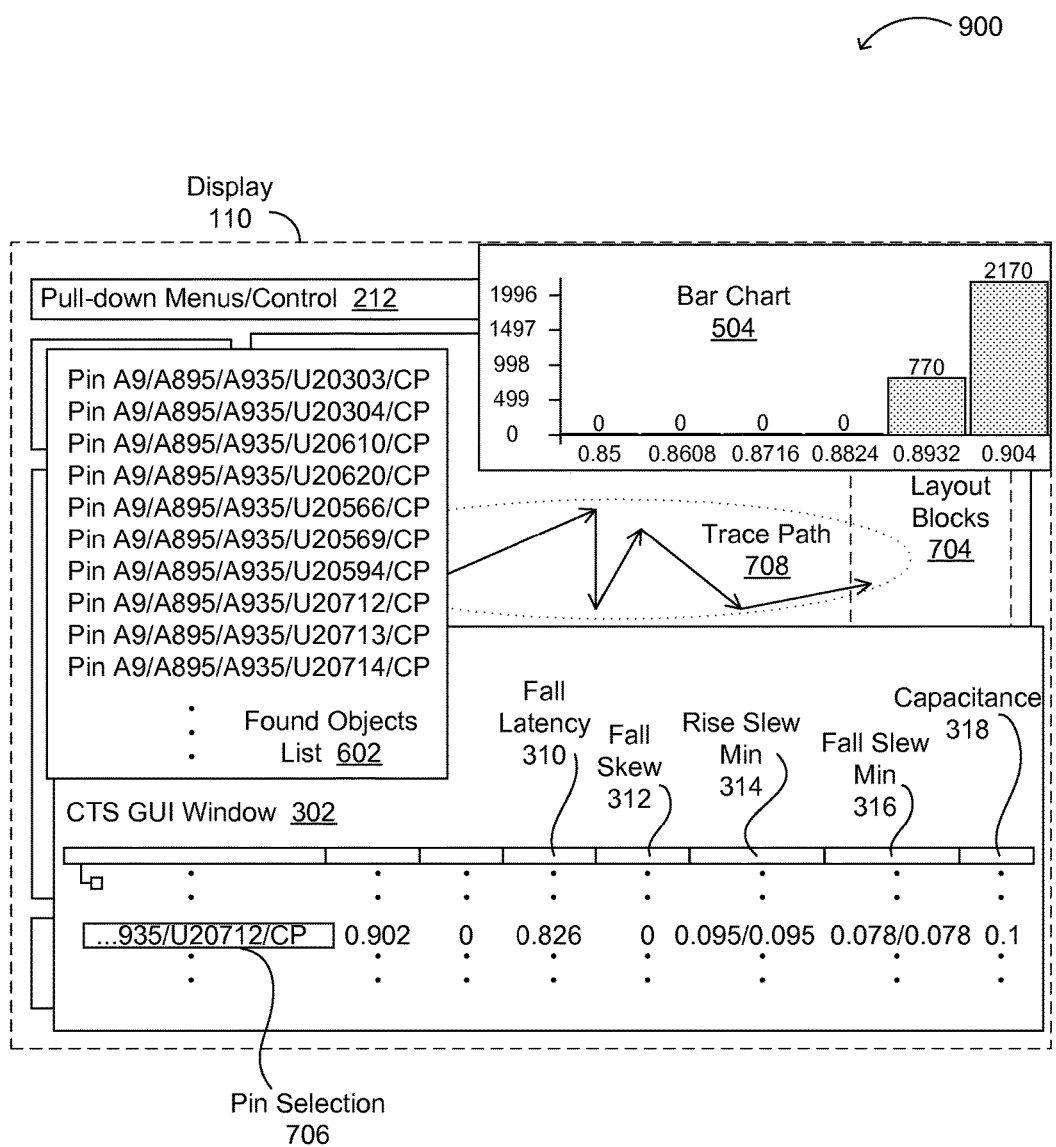
FIG. 9 illustrates an example screen shot of a CTS GUI in accordance with embodiments of the present invention.

A CTS sub-window can be launched in main GUI 200 on display 110. Using a CTS sub-window in particular embodiments, users can trace a synthesized clock tree in a browser and cross-highlight particular circuit nodes or nets to a chip physical view (e.g., in window 202). A user can click on an icon in or near pull-down menus/control 212 to activate a CTS GUI window. Alternatively, a user can employ tool command language (TCL) to activate the CTS GUI window. FIGS. 7 and 9 below show display 110 with CTS GUI window 302 overlaying a previous display portion.

Figure 3:
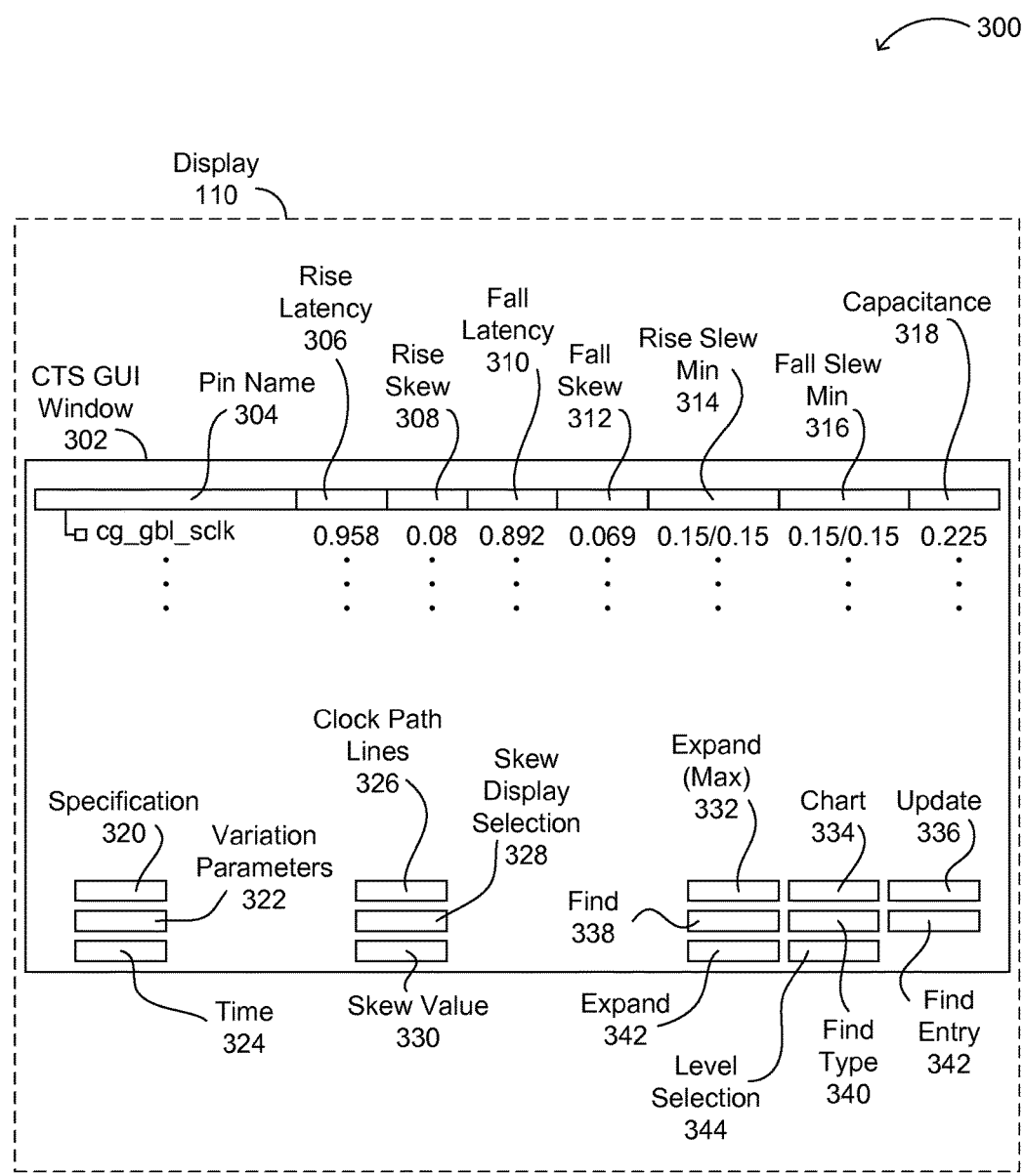
FIG. 3 illustrates an example CTS GUI window in accordance with embodiments of the present invention.

Referring now to FIG. 3, shown is an example CTS GUI window display 300 in accordance with embodiments of the present invention. In CTS GUI window 302, a particular pin name 304 (e.g., a unique clock tree path, node, or terminal connection) can have an analysis value associated therewith, such as rise latency 306, rise skew 308, fall latency 310, fall skew 312, rise slew minimum 314, fall slew minimum 316, and capacitance 318, or any other characteristic of interest.

Further, pop-out menus and/or buttons can include clock tree specifications 320, process/voltage/temperature (PVT) "corners" or variation parameters 322, time 324 (e.g., arrival time, latency), clock path lines 326 (e.g., color blue), display of skew indication 328, skew value 330 (e.g., max), a maximum for expansion 332, a find control 338 (e.g., find a pin of type 340, as entered 342), a number of levels 344 for expansion 342, a chart control 334 (e.g., for bar graph generation to view skews, insertion delays, etc.), and an update button 336. Clock tree specifications 320 can be a GUI selection box to allow a user to choose one of many different clock networks in a design for analysis, or to otherwise define a starting point for a particular clock tree network for analysis. In addition, certain components (e.g., buffers, inverters, multiplexers, etc.) can be filtered out by using appropriate selector buttons (not shown) on CTS GUI window 302.

In certain embodiments, a user operating via the GUI has full access to any number (e.g., 12) of variation parameters, all at the same time. In other words, there is no timing update to see data at any desired variation parameter, but rather all suitable timing data is available. This is because all such variation parameter CTS data can be enabled prior to loading the GUI. In contrast, conventional approaches may not allow analysis of all such data in context across any number of variation parameters at the same time. For example, expansion of variation parameters selection 322 indicates a wide variety of PVT conditions, such as voltage ranges, and library models (e.g., best, worst, typical) for transistors, process variance for wire capacitance, wire resistance, and via resistance, as well as other libraries that model transistor behavior over years (e.g., 5 years, 10 years, etc.) of use. Another source of variance can be test environments that are used to stress test parts before chip assembly (e.g., burn-in tests, high temperature tests, etc.). Table 1 below shows example variation parameters.

TABLE 1

| Variation Parameter | Process | Voltage | Temp |
| --- | --- | --- | --- |
| 1 | Max Capacitance | 0.9 V | 125° C. |
| 2 | Max Resistance | 0.9 V | 125° C. |
| 3 | Max Capacitance | 0.9 V | −40° C. |
| 4 | Max Capacitance & 10-Year Library | 0.9 V | 125° C. |
| 5 | Min Capacitance | 1.7 V | 30° C. |
| 6 | Min Capacitance | 1.4 V | 140° C. |
| 7 | Min Capacitance | 1.2 V | −40° C. |

TABLE 1-continued

| Variation Parameter | Process | Voltage | Temp |
|---|---|---|---|
| 8 | Min Resistance | 1.7 V | −30° C. |
| 9 | Min Capacitance | 0.7 V | −30° C. |
| 10 | Max Capacitance, Max Via | 0.9 V | 125° C. |
| 11 | Min Capacitance, Min Via | 1.7 V | 30° C. |

Figure 4:
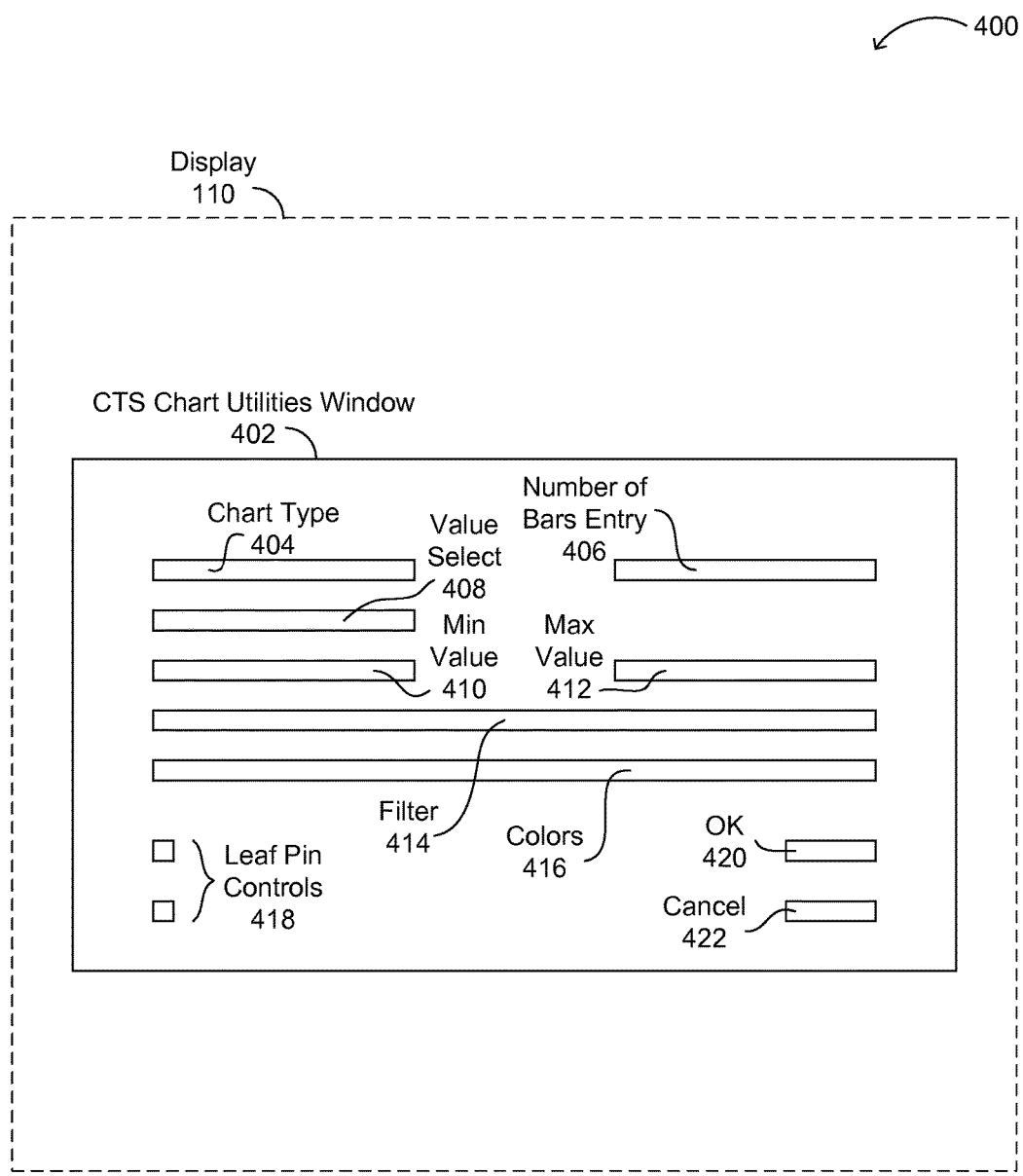
FIG. 4 illustrates an example CTS charting utilities and analysis window in accordance with embodiments of the present invention.

Referring now to FIG. 4, shown is an example CTS charting utilities and analysis window display 400 in accordance with embodiments of the present invention. By selecting the "chart" button 334 in CTS GUI window 302, CTS chart utilities window 402 can be launched. Here, a user can select a type of chart 404 (e.g., a "bar" histogram chart), as well as particular values 408 (e.g., arrival times, skews, slews, capacitance, etc.) for analysis. Also, details for the type of chart (e.g., a number of bars 406 for a bar chart), as well as minimum 410 and maximum 412 values, filtering 414, colors 416, and leaf pin controls 418 (e.g., restrictions/exclusions, etc.), can be selected. The settings in CTS chart utilities window 402 can be accepted (OK 420) or reset (cancel 422).

As an alternative to a bar chart, an XY-plot can be generated from the CTS data. While histogram plots may be more suitable for showing accurate skew measurements and analysis of outliers, XY-plots can be an effective analysis approach for viewing leaf registers and clock insertion delays to child blocks at the chip level. A user can select any point in such a plot, in similar fashion to selecting histogram bars, as discussed herein. Also, bar graphs can be used to view distributions, and XY-plots to analyze endpoints and useful skew.

Figure 5:
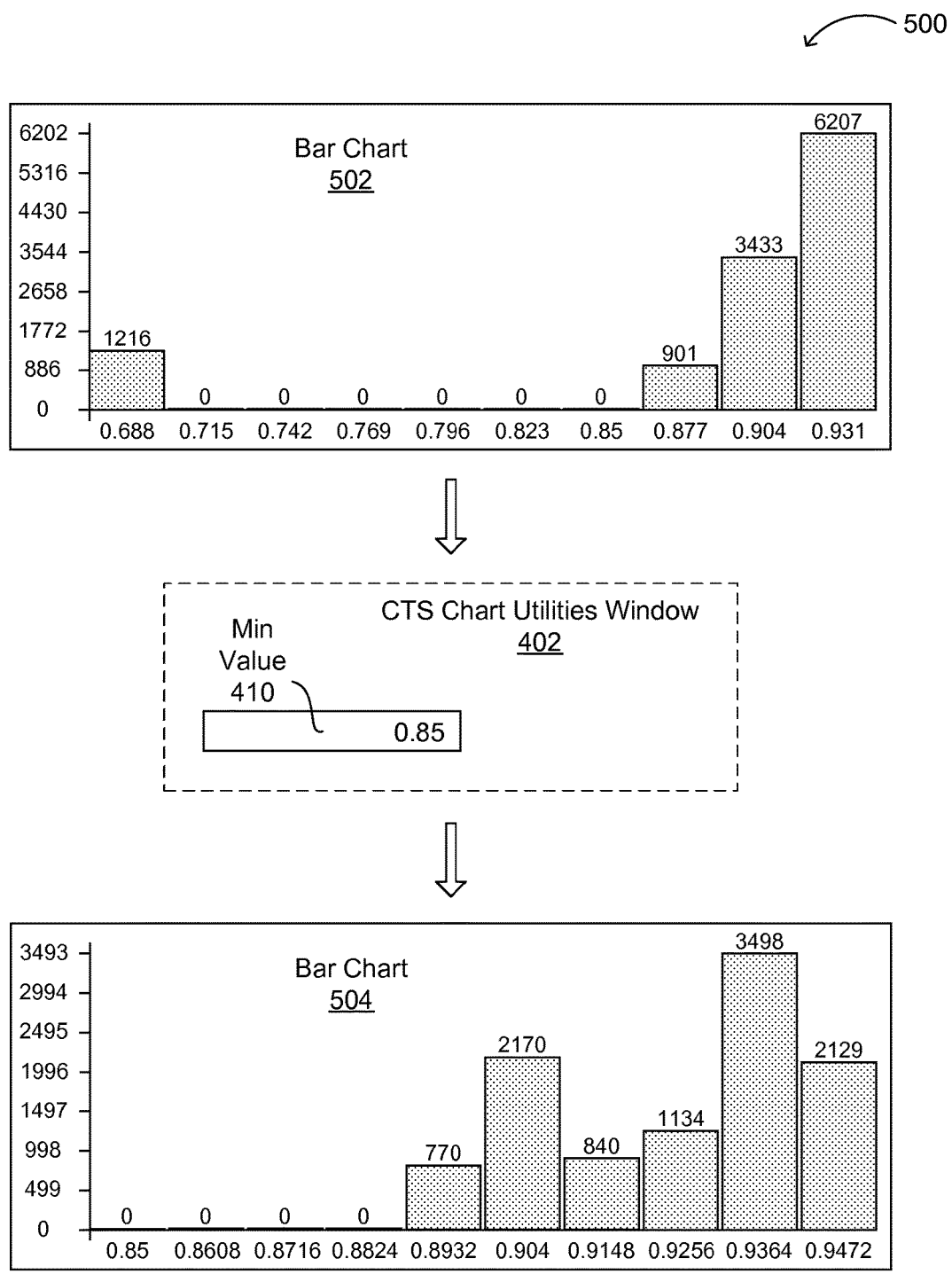
FIG. 5 illustrates example bar charts and analysis windows in accordance with embodiments of the present invention.

Referring now to FIG. 5, shown are example bar charts and analysis windows 500 in accordance with embodiments of the present invention. In bar chart 502, intentional offset pins are shown on the left, with remaining registers on the right side. Each bar can represent a number of registers or pins, nodes, etc., on the synthesized clock tree with a given value (e.g., rise arrival time value).

In order to focus on main non-skewed registers, the chart window can be updated to focus on a rise arrival range greater than 0.85 ns. This can be done by typing "0.85" in the minimum value entry 410, followed by the "OK" button 420 in CTS chart utilities window 402. An example of a resulting zoomed-in rise arrival plot is shown in bar chart 504.

Figure 6:
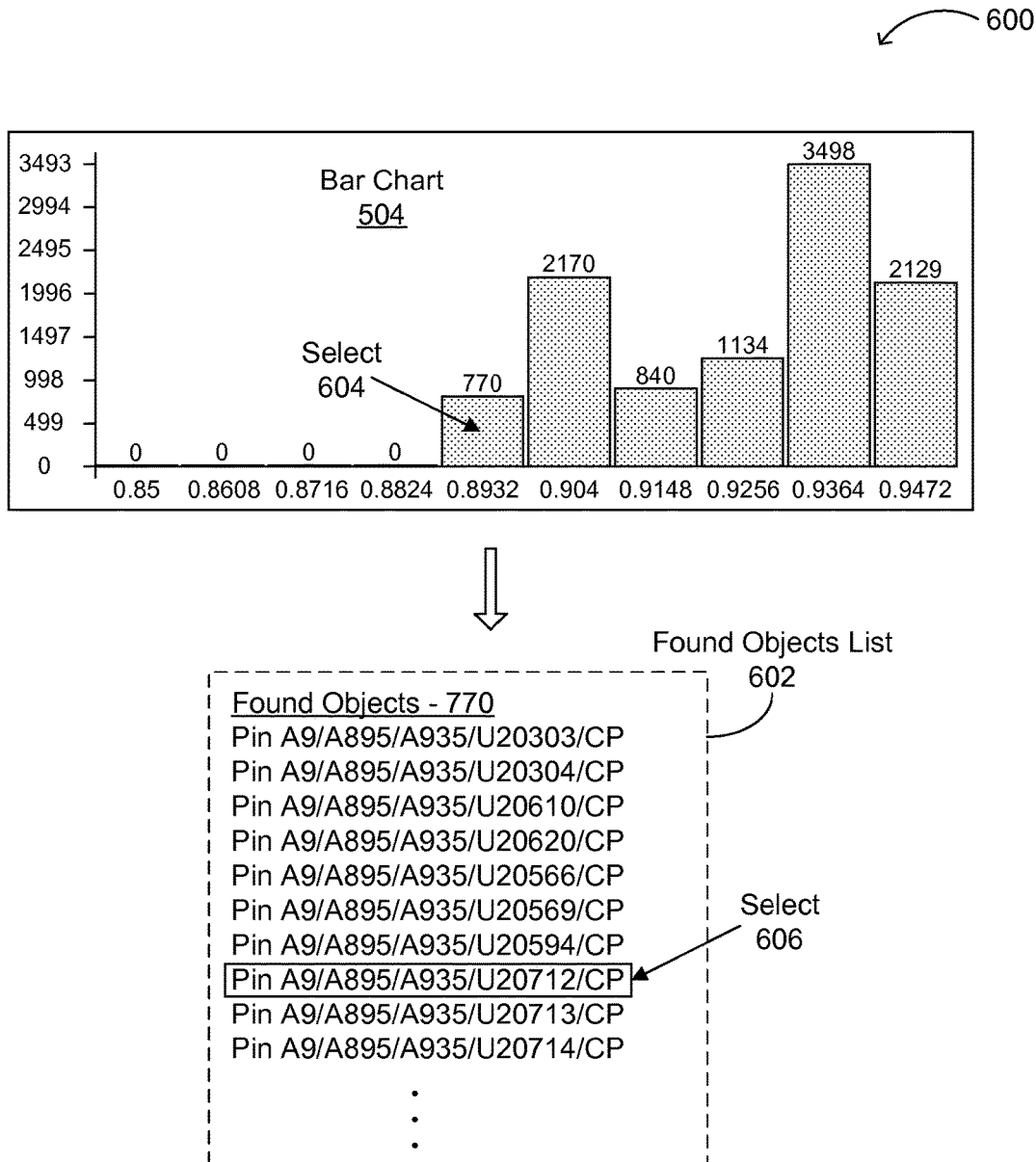
FIG. 6 illustrates an example found objects window with bar chart correlation in accordance with embodiments of the present invention.

Referring now to FIG. 6, shown is an example found objects window with bar chart correlation 600 in accordance with embodiments of the present invention. A user can analyze example bar chart 504 by selecting (e.g., select 604) any bar or point to invoke a corresponding found objects list 602. For example, pop-up list 602 shows which pins and/or registers are included in the selected bar or point 604. This pin/register detail can be cleared, closed, or all pins can be selected. For example, a selection 606 can be made in list 602 for viewing more detail, such as a clock tree path trace, for selected pin A9/A895/A935/U20712/CP.

Referring now to FIG. 7, shown is an example path trace in a main GUI window 700 in accordance with embodiments of the present invention. The pins in example bar chart 504 can be cross-analyzed and correlated to the physical layout view 202 by selecting (e.g., pin selection 706) one of the pins in CTS GUI window 302 (e.g., when a user is working directly in CTS GUI window 302) or found objects list 602 (e.g., when a user is analyzing data with charts). For example, chip layout view 202 includes layout blocks 702 and 704. A correlation between pin selection 706 to the physical layout view path trace 708 in the main GUI physical or layout view is shown. Alternatively, actual layout paths can also be highlighted in chip layout view 202. Further, one or more pins can be selected and displayed, such as in a display sequence of different trace paths, or in a simultaneous or overlapping display of corresponding trace paths to multiple selected pins.

Figure 8:
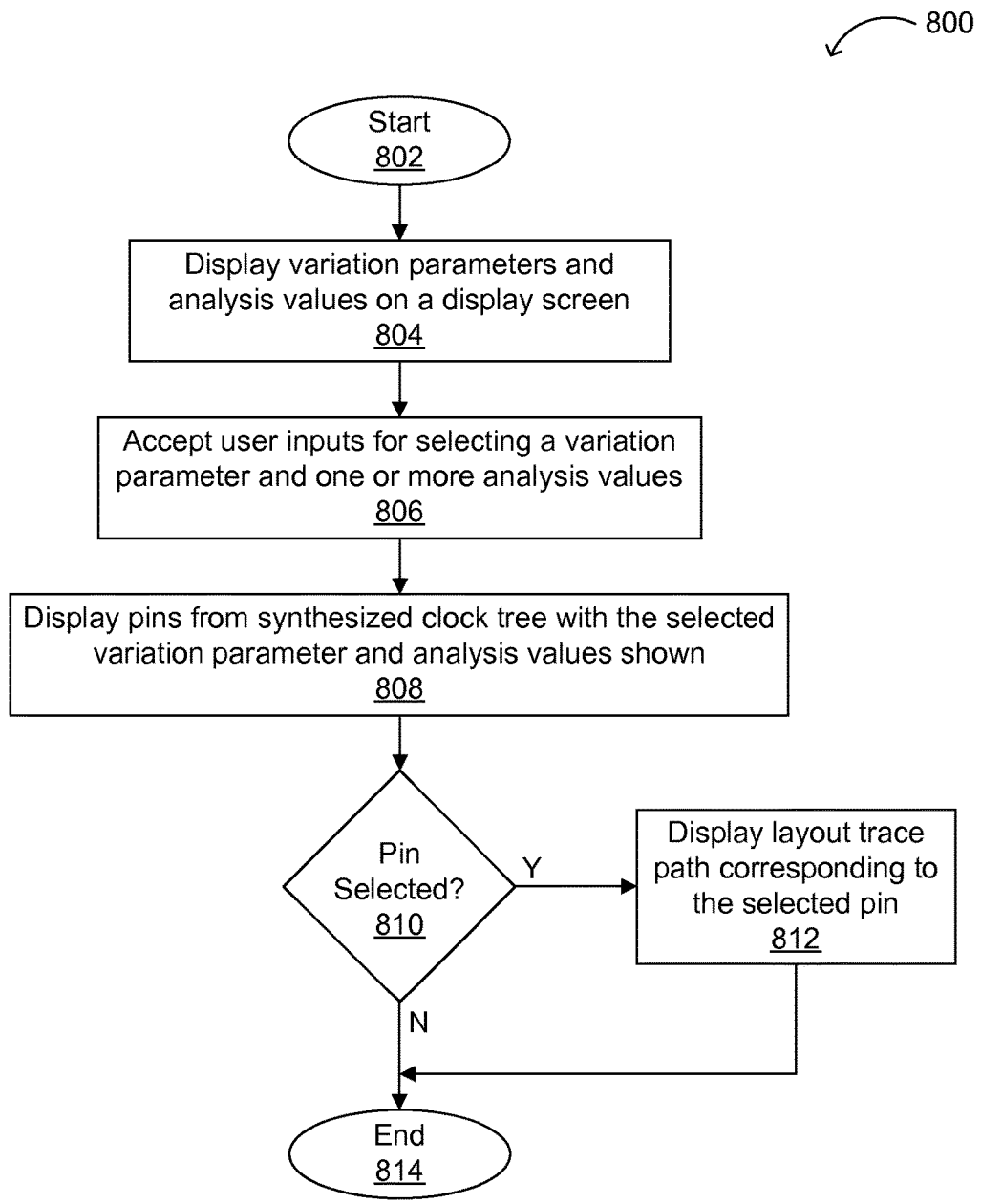
FIG. 8 illustrates a flow diagram of an example method of analyzing CTS results using a GUI in accordance with embodiments of the present invention.

Referring now to FIG. 8, shown is a flow diagram of an example method 800 of analyzing CTS results using a GUI in accordance with embodiments of the present invention. The flow begins 802, and variation parameters and analysis values can be displayed on a display screen (804). A user can select a variation parameter and one or more analysis values (806). Pins from a synthesized clock tree can be displayed with the selected variation parameter and analysis values shown (808). This display can also include graphs (e.g., histograms, XY-plots, etc.) if selected. Also, a particular pin can be selected (810), for a corresponding layout trace path display (812), thus completing the flow 814.

Referring now to FIG. 9, shown is an example screen shot 900 of a CTS GUI in accordance with embodiments of the present invention. As shown, various windows (e.g., CTS window 302, bar chart 504, and found objects list 602) can be overlapped on display 110.

Although the description has been described with respect to particular embodiments thereof, these particular embodiments are merely illustrative, and not restrictive. For example, while particular menu choices, layout examples, and variation parameters have been described, any suitable menus, layouts, arrangements, and/or parameters can also be supported in particular embodiments.

Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

A "computer-readable medium" for purposes of particular embodiments may be any medium that can contain, store, communicate, propagate, or transport the program for use by or in connection with the instruction execution system, apparatus, system, or device. The computer readable medium can be, by way of example only but not by limitation, an electronic, magnetic, optical, electromagnetic, infrared, or semiconductor system, apparatus, system, device, propagation medium, or computer memory. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, a latitude of modification, various changes and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A method for managing a volume of data, pertaining to a synthesized clock tree, on a graphical user interface (GUI), the method comprising:
    displaying, on a display screen, a plurality of variation parameters for the synthesized clock tree, wherein the synthesized clock tree includes a plurality of pins, and one or more timing analysis result values associated with at least one of the plurality of pins, the variation parameters comprising one or more of process variations, voltage variations, temperature variations, or library model variations;
    accepting a first signal from a user input device to select one of the variation parameters;
    accepting a second signal from the user input device to select one or more of the timing analysis result values; and
    displaying, on the display screen, at least one of the plurality of pins from the synthesized clock tree with the selected process variation parameter and the selected one or more timing analysis result values.

2. The method of claim 1, further comprising:
    accepting a third signal from the user input device for selecting one of the plurality of pins; and
    displaying on the display screen a layout path trace corresponding to the selected pin.

3. The method of claim 1, wherein the displaying the plurality of pins comprises displaying a bar chart plot.

4. The method of claim 1, wherein the displaying the plurality of pins comprises displaying an XY graph plot.

5. The method of claim 1, wherein the plurality of variation parameters comprises process, voltage, temperature, and library model variations.

6. The method of claim 1, wherein the one or more timing analysis result values comprise one or more of the following: rise latency, rise skew, fall latency, fall skew, rise slew minimum, or fall slew minimum.

7. The method of claim 1, wherein the one or more timing analysis result values comprise capacitance.

8. An apparatus, comprising:
    one or more processors; and
    logic encoded in one or more tangible media for execution by the one or more processors, that when executed by the one or more processors causes the processors to perform a method for managing a volume of data, pertaining to a synthesized clock tree, on a graphical user interface (GUI), the method comprising:
        displaying a plurality of variation parameters for the synthesized clock tree, wherein the synthesized clock tree includes a plurality of pins, and one or more timing analysis result values associated with at least one of the plurality of pins, the variation parameters comprising one or more of process variations, voltage variations, temperature variations, or library model variations;
        accepting a first signal from a first user input device to select one of the variation parameters;
        accepting a second signal from a second user input device to select one or more of the timing analysis result values; and
        displaying at least one of the plurality of pins from the synthesized clock tree with the selected variation parameter and the selected one or more timing analysis result values on a display screen.

9. The apparatus of claim 8, wherein the method further comprises:
    accepting a third signal from a third user input device for selecting one of the plurality of pins; and
    displaying a layout path trace corresponding to the selected pin.

10. The apparatus of claim 8, wherein:
    the displaying comprises displaying a plot; and
    the plurality of variation parameters comprises process, voltage, temperature, and library model variations.

11. The apparatus of claim 8, wherein the one or more timing analysis result values comprise capacitance.

12. The apparatus of claim 8, wherein the one or more timing analysis result values comprise one or more of the following: latency, skew, or slew.

13. A tangible computer-readable storage device including instructions executable by a processor, that when executed by the processor cause the processor to perform a method for managing a volume of data, pertaining to a synthesized clock tree, on a graphical user interface (GUI), the method comprising:
    displaying a plurality of variation parameters for the synthesized clock tree, wherein the synthesized clock tree includes a plurality of pins, and one or more timing analysis result values associated with at least one of the plurality of pins, the variation parameters comprising one or more of process variations, voltage variations, temperature variations, or library model variations;
    accepting a first signal from a user input device to select one of the variation parameters;
    accepting a second signal from the user input device to select one or more of the timing analysis result values; and
    displaying at least one of the plurality of pins from the synthesized clock tree with the selected variation parameter and the selected one or more timing analysis result values.

14. The computer-readable storage device of claim 13, wherein the method further comprises:
    accepting a third signal from the user input device for selecting one of the plurality of pins; and displaying on the display screen a layout path trace corresponding to the selected pin.

15. The computer-readable storage device of claim 13, wherein the plurality of variation parameters comprises process, voltage, and temperature variations.

16. The computer-readable storage device of claim 13, wherein the one or more timing analysis result values comprise one or more of the following: rise latency, rise skew, fall latency, fall skew, rise slew minimum, and fall slew minimum.

17. The computer-readable storage device of claim 13, wherein the one or more timing analysis result values comprise capacitance.

18. The method of claim 1, further comprising receiving a design netlist and performing clock tree synthesis for the design netlist.

19. The method of claim 1, further comprising displaying, on the display screen, a control for selection of corners for two or more of the variation parameters.

20. The method of claim 1, further comprising displaying, on the display screen, a control for selection of a clock tree node of the synthesized clock tree as a starting point for timing analysis.

* * * * *